(12) United States Patent
Hong

(10) Patent No.: US 7,246,291 B2
(45) Date of Patent: Jul. 17, 2007

(54) METHOD FOR LOCALIZATION AND GENERATION OF SHORT CRITICAL SEQUENCE

(75) Inventor: Eric Liau Chee Hong, München (DE)

(73) Assignee: Infineon Technologies AG, Munich (DE)

(*) Notice: Subject to any disclaimer, the term of this patent is extended or adjusted under 35 U.S.C. 154(b) by 343 days.

(21) Appl. No.: 10/838,535

(22) Filed: May 4, 2004

(65) Prior Publication Data
US 2005/0251718 A1 Nov. 10, 2005

(51) Int. Cl.
*G01R 31/28* (2006.01)

(52) U.S. Cl. .................. 714/738; 714/741

(58) Field of Classification Search ........ 714/724, 714/738, 741; 703/13
See application file for complete search history.

(56) References Cited

U.S. PATENT DOCUMENTS

| | | | | |
|---|---|---|---|---|
| 5,708,774 A | * | 1/1998 | Boden | 714/38 |
| 5,745,501 A | * | 4/1998 | Garner et al. | 714/741 |
| 6,810,372 B1 | * | 10/2004 | Unnikrishnan et al. | 703/13 |
| 2003/0154432 A1 | * | 8/2003 | Scott et al. | 714/724 |

* cited by examiner

*Primary Examiner*—James C Kerveros
(74) *Attorney, Agent, or Firm*—Slater & Matsil, L.L.P.

(57) ABSTRACT

A method for localization and generation of short critical sequence uses an automatic test equipment to test an electronic device (e.g., memory device) by circuit simulation to localize and re-generate a very short critical sequence from a set of long worst-case pattern. The method includes defining a failure mechanism condition for search and localization process and re-production of the short critical sequence based on a mutation process from the critical sequence detected from a step (I) phase and number of pattern defined in population using a genetic algorithm step (II) phase.

17 Claims, 4 Drawing Sheets

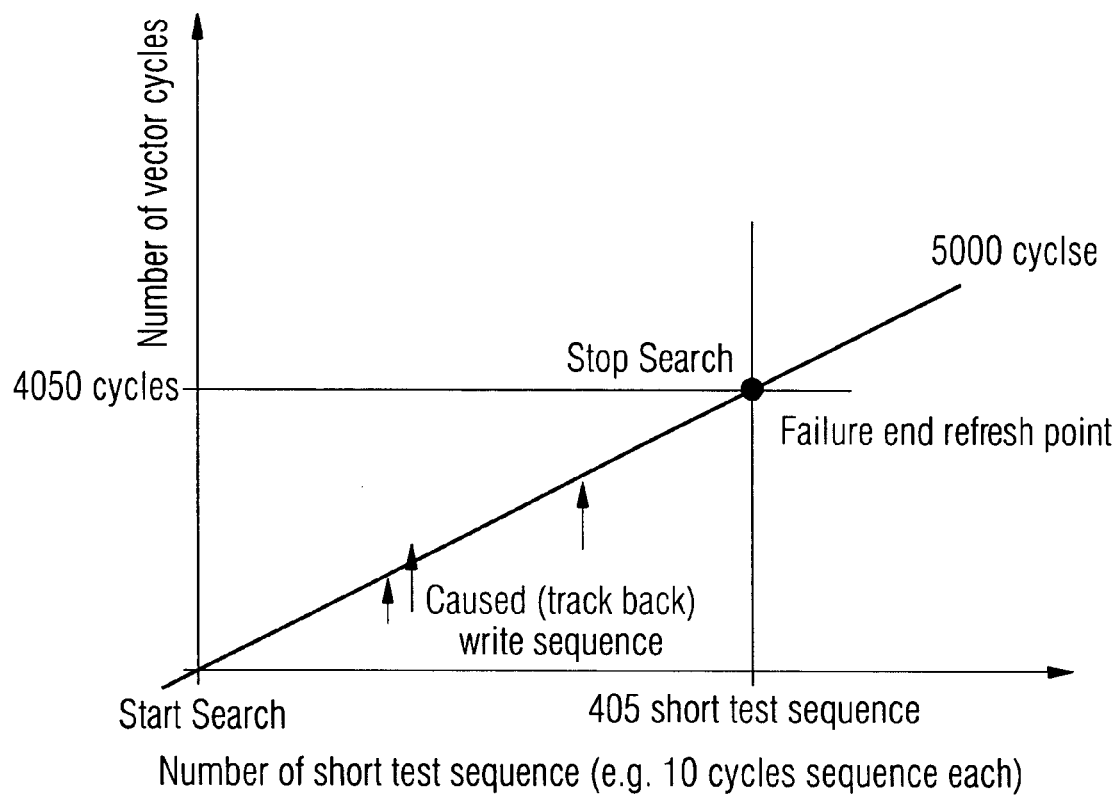

FIG 3

| # | Coding | Throw Out Vector vs. Failure Mechanism Conditions | Practical ATE Cycle-Based Pattern |
|---|--------|---------------------------------------------------|-----------------------------------|
| 1 | 3345120 | Remain | Write Adress 345 Data 12 Data Output 0 |
| 2 | 3345100 | Remain | Write Adress 345 Data 10 Data Output 1 |
| 3 | 4045200 | Throw Out Test: don't care | Idle Adress 045 Data 20 Data Output 0 |
| 4 | 2245081 | Remain | Read Adress 245 Data 08 Data Output 1 |
| 5 | 3805002 | Remain | Write Adress 805 Data 00 Data Output 2 |
| 6 | 3645070 | Throw Out Test: dummy write | Write Adress 645 Data 07 Data Output 0 |
| 7 | 2745182 | Remain | Read Adress 745 Data 18 Data Output 2 |
| 8 | 5245110 | Throw Out Test: don't care | Idle Adress 245 Data 11 Data Output 0 |
| 9 | 4205050 | Throw Out Test: don't care | Idle Adress 205 Data 04 Data Output 0 |
| 10 | 4145021 | Throw Out Test: don't care | Idle Adress 145 Data 02 Data Output 1 |
| 11 | 3786010 | Remain | Write Adress 786 Data 01 Data Output 0 |
| 12 | 4105060 | Throw Out Test: don't care | Idle Adress 105 Data 06 Data Output 0 |
| 13 | 2075181 | Remain | Read Adress 075 Data 18 Data Output 1 |
| 14 | 2005170 | Remain | Read Adress 005 Data 17 Data Output 0 |
| 15 | 3045120 | Throw Out Test: dummy write | Write Adress 045 Data 12 Data Output 0 |

METHOD FOR LOCALIZATION AND GENERATION OF SHORT CRITICAL SEQUENCE

TECHNICAL FIELD

The present invention relates generally to a system and method for testing electronic devices, and more particularly to a system and method for localization and generation of short critical sequences.

BACKGROUND

Embodiments of the invention concern a method for localization and generation of short critical sequence using automatic test equipment to test an electronic device by circuit simulation. For example, a memory device may be tested to localize and regenerate a very short critical sequence from a set of long worst-case patterns.

A major challenge and technical problem of the prior art is to figure out how to localize and regenerate a very short critical sequence automatically from a set of long worst-case patterns. In many situations, a set of worst-case patterns is detected, but they cannot be used to pin point the critical sequence directly via circuit-level simulation.

The pattern sequence will simply take a very long time to run simulations. For example, 200 pattern cycles can take approximately five days for simulation of a device. In addition, it is very difficult to analyze the failure based on a few thousand sequence cycles. Further, since not every sequence uncovers the problem, it is difficult to determine the critical issues. Ultimately, it is necessary to narrow down a long sequence into a very small sequence, which can pinpoint the problem directly.

Usually, a set of long worst-case test patterns can either be detected by a random approach or an optimization (neural network and generic algorithm as proposed before) approach, which can guarantee at least an equal or better worst-case sequence than the original long pattern. This sequence can then be used to address the problem accurately in an ATE (automatic test equipment) analysis phase as well as a circuit simulation phase.

The typical way of dealing with this problem is very inefficient and often just comprises manual trial and error for different smaller pieces of pattern sequence. Even so, it may either take a long time to extract this short sequence with less worst-case possibilities or cannot detect the same failure mechanism at all. It was found that in a situation where a failure occurs at completely different locations; one is needed to provoke another. In order to obtain the full effect of the failure, the methodology must be able to determine both the cause and effect sequence.

Thus if one tries to cut the pattern into many small pieces in a systematic way (manual attempts are usually tried. Alternately a person may just figure it out. However, there may be an unbelievable number of combinations), then one may never find the short critical sequence to provoke or cause the same or similar failure again. Presently, there simply does not exist a tool or standard technique.

In the following paragraphs, there are listed some practical technical problems for extracting a short critical sequence from a set of long patterns, which include the disadvantages under the prior art. In one case, the pattern could systematically be manually separated into many smaller pieces that are then evaluated one by one. In any event, simply taking a long time cannot guarantee the extraction is accurate.

If a failure is provoked by several random vector locations, it is likely that one must be provoked by another to generate the full effect of the failure. In this situation the typical systematic way will either fail to detect this sequence or a very large effort (time) using a very experienced engineer may be required to detect the failure.

The present typical approach of narrowing down the pattern cannot determine the cause and effect sequence automatically and efficiently, since a very short sequence must be obtained for circuit-level simulation and detail analysis with an ATE (Automated Test Equipment). The typically used method cannot guarantee a very short sequence. In some cases, the manual process can cut the pattern down from around a million vector cycles to hundreds of cycles.

SUMMARY OF THE INVENTION

In one aspect, the present invention provides an accurate and fast localization of the short sequence instead of requiring extensive manual work. Embodiments of the invention can generate at least an equal or better worst-case short sequence. Further, embodiments of the invention can determine the localization and generation of short critical sequence efficiently and automatically.

The preferred embodiment of the invention is based on two different steps. The first step is to search and localize the sequence (i.e., cause and effect) and the second step is further optimization of the detected sequence and generation of another set of short sequences having at least an equal or better worst-case performance than the original sequence. The combination of the first and the second steps create an automatic extraction short sequence concept using evolution technique (e.g. generic algorithm).

A major advantage of the invention is that the inventive technique provides an accurate and fast localization of the short sequence instead of requiring manual work. Furthermore, the inventive technique guarantees at least that an equal or better worst-case short sequence is generated using the evolution technique. The typical or prior art methods cannot handle this problem efficiently and automatically.

BRIEF DESCRIPTION OF THE DRAWINGS

For a more complete understanding of the present invention, and the advantages thereof, reference is now made to the following descriptions taken in conjunction with the accompanying drawings. In which:

FIG. 2 shows two sub-steps of the first step;

FIG. 3 shows the third sub-step of the first step with the final compression solution of the short sequence via bound and search technique; the final short sequence satisfying all failure mechanism condition.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Figure 1:
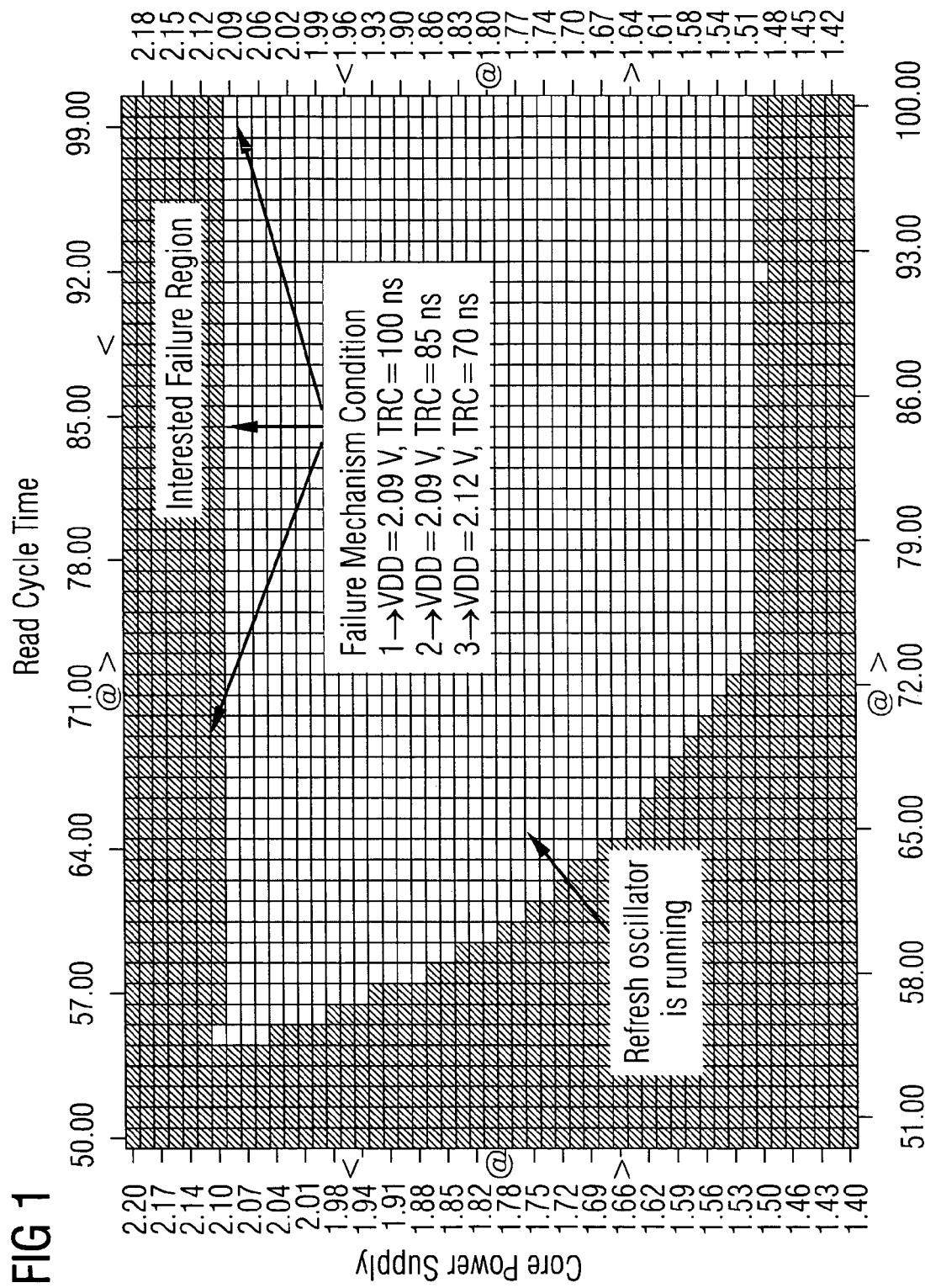
FIG. 1 shows experimental results using 5000 worst-case pattern sequence (Y-axis: VDD Power Supply (V), X-axis: TRC Memory Read Cycles (ns))

In the step (I) phase the failure mechanism condition for search and localization process is defined. The failure mechanism condition can be a single point or multiple points depending on how the failure effect is described. Usually the failure can be easily referred to the shmoo plot analysis based on a long worst-case pattern sequence. For example, FIG. 1 shows failure conditions for 5000 vector cycles. The long pattern cycles provoke a high VDD malfunction at 2.09 V when the refresh-oscillator is free running.

As shown, the failure mechanism condition in this example is described by three multiple conditions as shown in FIG. 1. It is also possible to define more condition points in order to describe the failure effect as accurately as possible.

Next, the number of cycles for the short sequence is defined. For example, if 10 cycles are defined for the short sequence, the search process begins by dividing the long pattern into a group of 10 cycles sequences and testing each group with respect to the failure mechanism conditions. The search process will stop when the short sequence satisfies the failure mechanism conditions since the failure and reference sequence is reached. Thus, all pattern cycles or sequence after this reference point can be ignored.

The second search phase (I) is to determine or find out the cause and effect. The reference sequence shows the effect, and the cause must be referred to the number of reads in the reference sequence, and then track back to where the write sequence occurs (cause).

All write sequences are then extracted to combine with short sequences, and are tested with the failure mechanism condition. If the short sequence does not satisfy the condition, then all write sequences will be extended with additional cycles referring to the before and after vector cycles within each write sequence.

This process is repeated until the condition is satisfied again. Finally, a short sequence is defined or extracted, which is likely to be larger than 10 cycles, since the combinations are based on appending the short 10 cycles sequences. The final step (I) phase is to then compress the extracted sequence again to 10 cycles. Thus, the algorithm will first determine all out of range or don't care vectors and dummy write vectors. This occurs since all readings that refer to this write or failure is already based on the failure end reference sequence. They will then be evaluated and tested with respect to the failure mechanism conditions one by one (bound and search technique) until 10 cycles or more and the mechanism conditions are satisfied.

The step (I) phase can be described in three sub-steps, as shown in FIGS. 2 and 3:

1.1 Find the effect or reference sequence that ended in a failure.

1.2 Find the cause of the effect by a tracing back process to the write sequence (the cause and the effect).

1.3 Determine the compression solution of the short sequence by bound and search techniques. The final compression situation is the final short sequence satisfying all failure mechanism conditions.

In the step (II) phase (optimization), the re-production of the short critical sequence is based on a mutation process derived from the critical sequences detected from step (I) and the number of patterns defined in the population using a genetic algorithm. The mutation process alters the information for each different signal group in a complete random way (e.g. address bus, command bus and data bus; this is an example of a memory device). In this way it is possible to study if the impact of the effect is based on which groups of signals change.

The population is the collection of all the possible and potential critical short sequences in the pending case. The population will contain at least one original critical sequence detected from step (I), which is combined with different mutation sequences. This combination is then used to start the evolution optimization process. For example, if each population contains 10 patterns, then the re-production will create another 9 short sequences by mutation processes and keep one original sequence (in order to avoid loss of the originality of the critical sequence).

The optimization objective function is defined by an analysis objective determined from the failure mechanism. As the previous example shows, the worst-case failure mechanism is that the lower the VDD failure, the better the short critical sequence. Thus, VDD failure is the objective function with respect to the different critical short sequences. For each critical short sequence. VDD will be voided between 1.5 V to 2.2 V using a characterization search (e.g. successive approximation which can detect a shift of the device parameters), to determine VDD failure point.

Therefore, it is seen that the objective in this specific example is to detect a critical short sequence, which can cause a VDD failure to occur earlier (e.g., VDD<2.09 V). This approach is guaranteed to generate a new set of very short critical sequences with at least an equal or better worst-case pattern. Therefore, the objective function (fitness in GA—Genetic Algorithm) is defined such that the analysis of the worst-case failure mechanism is the function of different short critical sequences as shown in equation [1] below.

Optimization: Worst Case Failure Mechanism (Short Critical Sequence)→Worst-case failure mechanism measured by characterization search method.→Optimization using Genetic Algorithm (GA). [1]

The step (II) phase has the following sub-steps:

2.1 Defining an analysis objective of a failure mechanism for fitness in a GA process 2.2 Defining the number of potential solutions in each GA population 2.3 Mutating a pattern based on a critical pattern sequence determined from step (I)

2.4 Combining all mutation patterns and original critical pattern from step (I)

2.5 Optimizing the fitness of a sequence as determined by a characterization search technique 2.6 The process is then repeated until the optimal solution is found or a maximum GA loop is found.

Figure 4:
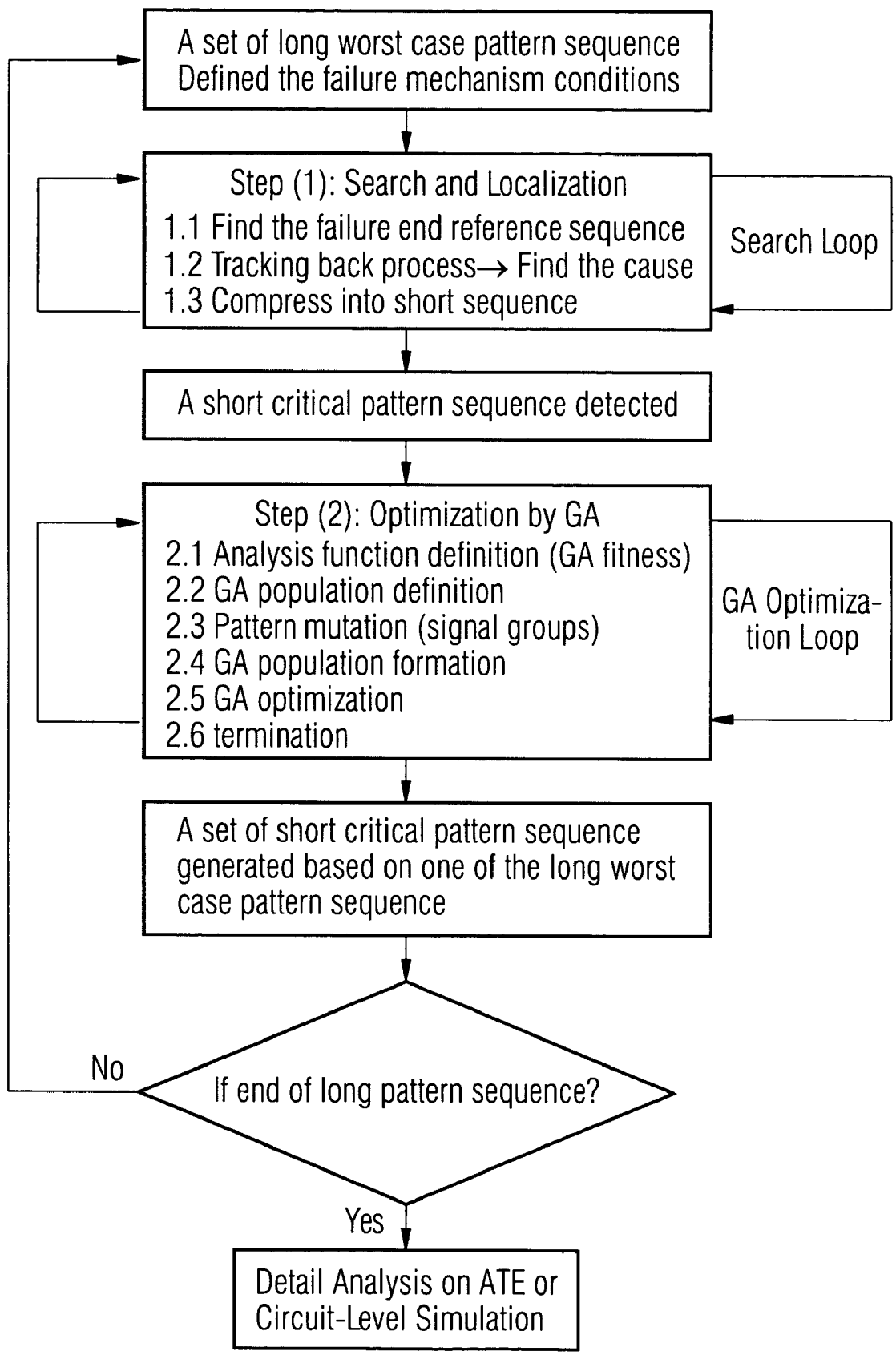
FIG. 4 shows the completed method of genetic linear and optimization technique.

The complete method of genetic linear search and optimization technique is shown at FIG. 4.

The complete description of a method for localization and generation of short critical sequence using an automatic test equipment to test an electronic device is defined below:

1. Input a set of worst-case patterns.
2. Define the failure mechanism condition for use in a search process.
3. Start the search and localization process with respect to the failure mechanism conditions using the long worst-case patterns.
4. Find the failure end reference sequence (effect)
5. Find the cause of the effect by tracking back process (cause and effect).

6. Determining the final compression solution of the short sequence by a bound and search technique (i.e., a final short sequence satisfying all failure mechanism conditions.
7. Repeating steps 4 to 6 until all failures and then cause has been determined and a compress solution determined.
8. Generating a short critical pattern sequence for the single worst-case pattern.
9. Start GA optimization using the short critical pattern sequence from step 7.
10. Defined the number of potential solutions in each GA population.
11. Use a pattern mutation process based on the critical pattern sequence from step 7.
12. Combining all mutation patterns and original critical pattern from step 7.
13. Optimizing the sequences until fitness is detected by the characterization search technique.
14. Repeating step 12 and 13 until optimization is completed.
15. The result is a set of better or equal critical pattern sequences generated for the single long worst-case pattern.
16. Repeating steps 1 to 15 until the end of a long worst-case pattern.
17. Detailing an ATE analysis or circuit-level simulation based on the determined very short critical pattern sequences.

A practical example is described below. A design robustness analysis for a P14 PRAM memory experiences a detected cold temperature hand up sequence after only 10 vector cycles. It is noted that a typical or prior art march pattern or random pattern (20K vector cycles) via a random approach cannot detected this problem at all.

The experimental results show a 10 cycles patterns vs. a 20K, 40K, 5000 and 1000 cycles patterns. Surprisingly, the 10 cycles pattern show the worst-case condition much better than any one of the above pattern sequence.

A set of worst-case input signal toggling patterns are first generated based on previous proposal (NNGA). Two patterns are detected that show a device hand up problem at cold temperatures. The first or pattern 1 is 5000 cycles as actually shown in FIG. 1. The pattern shows that the hand up occurs above VDD=2.09 V. The second or pattern 2 is 1000 cycles, shows the hand up occur not at VDD=2.04 V. Unfortunately, both of these patterns are too large for direct circuit-level (full-chip) simulation or very detail analysis on ATE. Thus, this example illustrates how the invention becomes really useful during design analysis phase. The 5000 cycles Pattern 1 and the 1000 cycles Pattern 2 were used to generate a set of very short worst-case sequences (10 cycles only).

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method using automatic test equipment to test an electronic device by circuit simulation to localize and re-generate a very short critical sequence of test patterns from a set of long worst case-patterns, the method comprising:

defining a failure mechanism condition;
searching and localizing occurrences of said failure mechanism conditions; and
re-generating of the short critical sequence based on a mutation process of the long word case pattern of the critical sequence detected from a number of patterns defined in a population using a genetic algorithm.

2. A method according to claim 1 wherein the failure mechanism condition is defined as a single point or as multiple points.

3. A method according to claim 2 and comprising the step of defining a worst-case pattern sequence.

4. A method according to claim 1 at which the mutation process randomly alters the information for each different signal groups.

5. A method according to claim 4 wherein the electronic device comprises a memory device.

6. A method according to claim 5 wherein the mutation process alters information for signal groups derived from an address bus, a command bus and a data bus.

7. A method according to claim 1 wherein the defining, searching and localizing steps comprise the sub-steps:
finding the failure and reference sequence;
finding the cause of the effect by a tracking back process; and
determining the final compression solution of the short sequence via a bound and search technique.

8. A method according to claim 1 at which the regenerating step is defined by sub-steps comprising:
defining an analysis objective of failure mechanism for fitness in a GA (genetic algorithm) process;
defining a number of potential solutions in each GA population;
mutating a pattern based on a critical pattern sequence determined from a previous step,
combining all mutation patterns and original critical patterns from the previous step,
detecting fitness by characterization of the search technique and
repeating the process until the optimal solution is found or a maximum GA loop is found.

9. A method according to claim 1 wherein the electronic device comprises a memory device.

10. A method for providing a short critical sequence of steps for testing an electronic device comprising:
inputting a set of worst case pattern sequences;
defining a failure mechanism condition;
searching and locating one or more sequences that end in said failure mechanism condition;
tracking back through a located sequence to determine circuit parameters that cause the failure mechanism condition; and
compressing a located sequence that ends in the failure mechanism condition.

11. The method of claim 10 further comprising determining all of said compressed located sequences and generating a short critical pattern sequence for the single worst case patterns.

12. The method of claim 11 wherein said step of generating uses an evolution technique.

13. The method of claim 12 and further comprising optimizing said short critical pattern sequence.

14. The method of claim 12 wherein said evolution technique is a mutation of said optimized sequence.

15. The method of claim 14 wherein said evolution technique is selected from a generic algorithm.

16. The method of claim 13 wherein said optimizing step comprises:
   selecting the number of cycles in a short sequence;
   dividing said located sequence into a group of short sequences; and
   testing said group of short sequences.

17. The method of claim 13 further comprising optimizing all said short critical pattern sequences for each worst case pattern and determining an Automated Test Equipment (ATE) analysis or circuit level simulation based on all of said optimized short circuit pattern sequences.

* * * * *

UNITED STATES PATENT AND TRADEMARK OFFICE
CERTIFICATE OF CORRECTION

PATENT NO. : 7,246,291 B2  Page 1 of 1
APPLICATION NO. : 10/838535
DATED : July 17, 2007
INVENTOR(S) : Hong It is certified that error appears in the above-identified patent and that said Letters Patent is hereby corrected as shown below:

Col. 5, line 32, delete "hand" and insert --hang--.
Col. 5, line 42, delete "hand" and insert --hang--.
Col. 5, line 44, delete "hand" and insert --hang--.
Col. 5, line 46, delete "hand" and insert --hang--.
Col. 6, line 24, delete "and" and insert --end--.

Signed and Sealed this

Second Day of October, 2007

JON W. DUDAS
*Director of the United States Patent and Trademark Office*